US008874836B1

(12) United States Patent
Hayes et al.

(10) Patent No.: US 8,874,836 B1
(45) Date of Patent: Oct. 28, 2014

(54) SCHEDULING POLICY FOR QUEUES IN A NON-VOLATILE SOLID-STATE STORAGE

(71) Applicant: Pure Storage, Inc., Mountain View, CA (US)

(72) Inventors: John Hayes, Mountain View, CA (US); Shantanu Gupta, Mountain View, CA (US); John Davis, Mountain View, CA (US); Brian Gold, Mountain View, CA (US); Zhangxi Tan, Mountain View, CA (US)

(73) Assignee: Pure Storage, Inc., Mountain View, CA (US)

( * ) Notice: Subject to any disclaimer, the term of this patent is extended or adjusted under 35 U.S.C. 154(b) by 0 days.

(21) Appl. No.: 14/323,707

(22) Filed: Jul. 3, 2014

(51) Int. Cl.
G06F 12/00 (2006.01)
G06F 3/06 (2006.01)
G06F 12/02 (2006.01)
G06F 13/16 (2006.01)

(52) U.S. Cl.
CPC .......... *G06F 3/0659* (2013.01); *G06F 3/0688* (2013.01); *G06F 3/0619* (2013.01); *G06F 12/0246* (2013.01); *G06F 13/1626* (2013.01)
USPC .................... 711/103; 711/151; 711/E12.008

(58) Field of Classification Search
CPC ..... G06F 3/067; G06F 3/0683; G06F 3/0688; G06F 3/0689; G06F 12/0246; G06F 12/0253; G06F 13/1626; G06F 13/1631; G06F 2212/7202
See application file for complete search history.

(56) References Cited

U.S. PATENT DOCUMENTS

| 6,725,392 | B1 | 4/2004 | Frey et al. |
| 7,778,960 | B1 | 8/2010 | Chatterjee et al. |
| 7,908,448 | B1 | 3/2011 | Chatterjee et al. |
| 8,010,485 | B1 | 8/2011 | Chatterjee et al. |
| 8,010,829 | B1 | 8/2011 | Chatterjee et al. |
| 8,046,548 | B1 | 10/2011 | Chatterjee et al. |
| 8,086,911 | B1 | 12/2011 | Taylor |
| 8,145,838 | B1 | 3/2012 | Miller et al. |
| 8,225,006 | B1 * | 7/2012 | Karamcheti .................. 711/114 |
| 8,244,999 | B1 | 8/2012 | Chatterjee et al. |

(Continued)

OTHER PUBLICATIONS

Storer, Mark W., Greenan, Kevin M., Miller L. Ethan, Voruganti, Kaladhar; Pergamum: Replacing Tape with Energy Efficient, Reliable, Disk-Based Archival Storage.

(Continued)

*Primary Examiner* — Michael Krofcheck
(74) *Attorney, Agent, or Firm* — Womble Carlyle Sandridge & Rice LLP

(57) ABSTRACT

A method of applying scheduling policies is provided. The method includes distributing user data throughout a plurality of storage nodes through erasure coding, wherein the plurality of storage nodes are housed within a single chassis coupling the storage nodes as a cluster. The method includes receiving operations relating to a non-volatile memory of one of the plurality of storage nodes into a plurality of operation queues. The method includes evaluating each of the operations in the plurality of operation queues as to benefit to the non-volatile solid-state storage according to a plurality of policies. For each channel of a plurality of channels coupling the operation queues to the non-volatile memory, the method includes iterating a selection and an execution of a next operation from the plurality of operation queues, with each next operation having a greater benefit than at least a subset of operations remaining in the operation queues.

19 Claims, 8 Drawing Sheets

(56) References Cited

U.S. PATENT DOCUMENTS

| | | |
|---|---|---|
| 8,327,080 B1 | 12/2012 | Der |
| 8,479,037 B1 | 7/2013 | Chatterjee et al. |
| 8,498,967 B1 | 7/2013 | Chatterjee et al. |
| 8,522,073 B2 | 8/2013 | Cohen |
| 8,595,455 B2 | 11/2013 | Chatterjee et al. |
| 8,627,136 B2 | 1/2014 | Shankar et al. |
| 8,661,218 B1* | 2/2014 | Piszczek et al. ............. 711/167 |
| 8,700,875 B1 | 4/2014 | Barron et al. |
| 2002/0144059 A1* | 10/2002 | Kendall ....................... 711/118 |
| 2008/0295118 A1 | 11/2008 | Liao |
| 2010/0017444 A1* | 1/2010 | Chatterjee et al. ............ 707/204 |
| 2010/0268908 A1 | 10/2010 | Ouyang et al. |
| 2011/0060927 A1* | 3/2011 | Fillingim et al. ............. 713/320 |
| 2011/0219170 A1* | 9/2011 | Frost et al. .................... 711/103 |
| 2012/0246435 A1* | 9/2012 | Meir et al. .................... 711/169 |
| 2013/0060884 A1 | 3/2013 | Bernbo et al. |
| 2013/0073894 A1 | 3/2013 | Xavier et al. |
| 2013/0339635 A1* | 12/2013 | Amit et al. ................... 711/154 |
| 2014/0047263 A1 | 2/2014 | Coatney et al. |
| 2014/0136880 A1 | 5/2014 | Shankar et al. |

OTHER PUBLICATIONS

Hwang, Kai, Jin, Hai, Ho, Roy; RAID-x: A New Distributed Disk Array for I/O-Centric Cluster Computing.

* cited by examiner

SCHEDULING POLICY FOR QUEUES IN A NON-VOLATILE SOLID-STATE STORAGE

BACKGROUND

Solid-state memory, such as flash, is currently in use in solid-state drives (SSD) to augment or replace conventional hard disk drives (HDD), writable CD (compact disk) or writable DVD (digital versatile disk) drives, collectively known as spinning media, and tape drives, for storage of large amounts of data. Flash and other solid-state memories have characteristics that differ from spinning media, which may lead to scheduling conflicts in solid-state storage. Yet, many solid-state drives are designed to conform to hard disk drive standards for compatibility reasons, which makes it difficult to provide enhanced features or take advantage of unique aspects of flash and other solid-state memory.

It is within this context that the embodiments arise.

SUMMARY

In some embodiments, a method of applying scheduling policies to a non-volatile solid-state storage is provided. The method includes distributing user data throughout a plurality of storage nodes through erasure coding, wherein the plurality of storage nodes are housed within a single chassis that couples the storage nodes as a cluster. The method includes receiving operations relating to a flash memory of a non-volatile solid-state storage of one of the plurality of storage nodes into a plurality of operation queues. The method includes evaluating each of the operations in the plurality of operation queues as to benefit to the non-volatile solid-state storage according to a plurality of policies. For each channel of a plurality of channels coupling the operation queues to the flash memory, the method includes iterating a selection and an execution of a next operation from the plurality of operation queues, with each next operation having a greater benefit than at least a subset of operations remaining in the operation queues.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
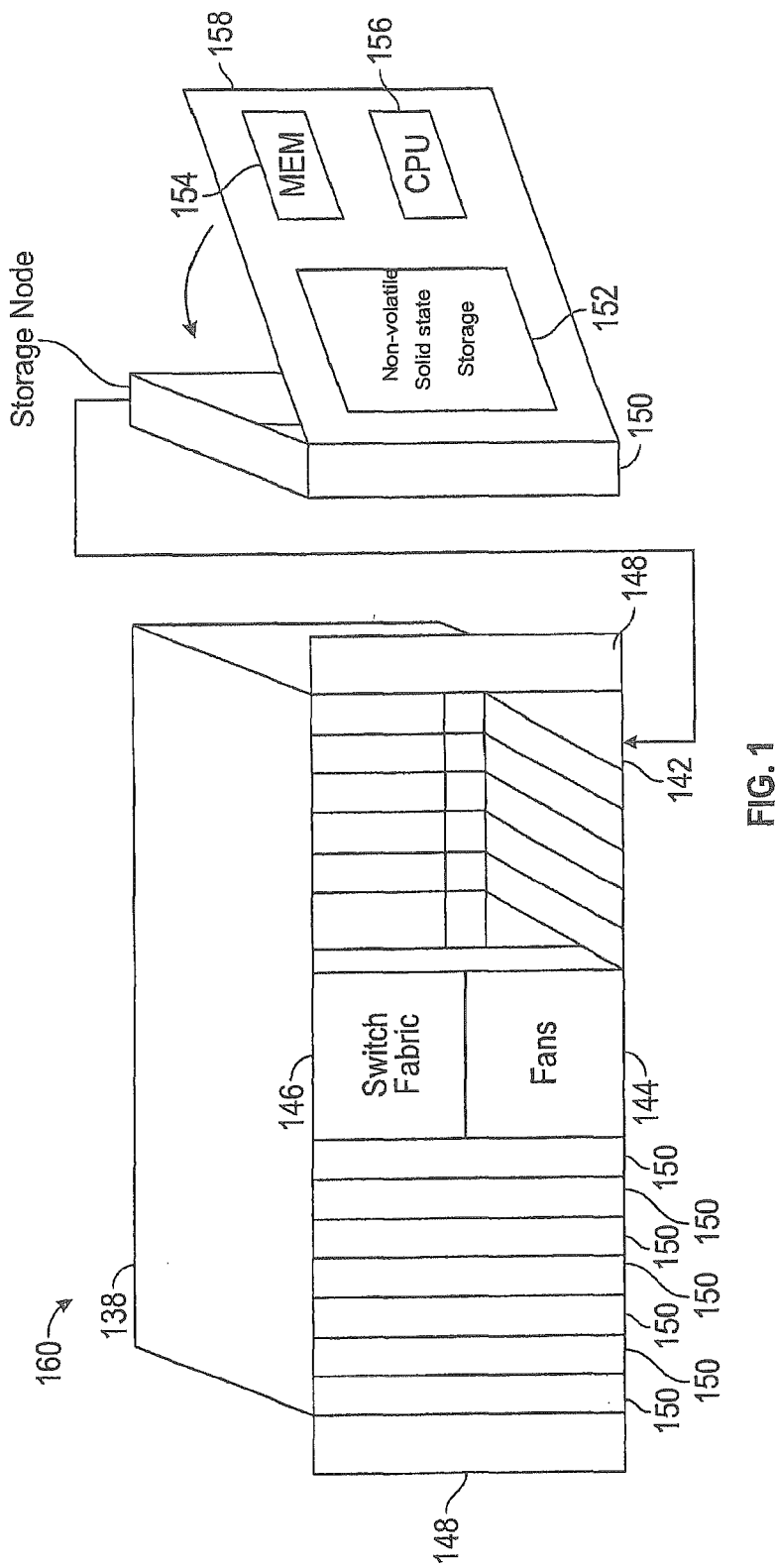
FIG. 1 is a perspective view of a storage cluster with multiple storage nodes and internal storage coupled to each storage node to provide network attached storage, in accordance with some embodiments.

The embodiments below describe a storage cluster that stores user data, such as user data originating from one or more user or client systems or other sources external to the storage cluster. The storage cluster distributes user data across storage nodes housed within a chassis, using erasure coding and redundant copies of metadata. Erasure coding refers to a method of data protection in which data is broken into fragments, expanded and encoded with redundant data pieces and stored across a set of different locations, such as disks, storage nodes or geographic locations. Flash memory is one type of solid-state memory that may be integrated with the embodiments, although the embodiments may be extended to other types of solid-state memory or other storage medium, including non-solid state memory. Control of storage locations and workloads are distributed across the storage locations in a clustered peer-to-peer system. Tasks such as mediating communications between the various storage nodes, detecting when a storage node has become unavailable, and balancing I/Os (inputs and outputs) across the various storage nodes, are all handled on a distributed basis. Data is laid out or distributed across multiple storage nodes in data fragments or stripes that support data recovery in some embodiments. Ownership of data can be reassigned within a cluster, independent of input and output patterns. This architecture described in more detail below allows a storage node in the cluster to fail, with the system remaining operational, since the data can be reconstructed from other storage nodes and thus remain available for input and output operations. In various embodiments, a storage node may be referred to as a cluster node, a blade, or a server.

The storage cluster is contained within a chassis, i.e., an enclosure housing one or more storage nodes. A mechanism to provide power to each storage node, such as a power distribution bus, and a communication mechanism, such as a communication bus that enables communication between the storage nodes are included within the chassis. The storage cluster can run as an independent system in one location according to some embodiments. In one embodiment, a chassis contains at least two instances of both the power distribution and the communication bus which may be enabled or disabled independently. The internal communication bus may be an Ethernet bus, however, other technologies such as Peripheral Component Interconnect (PCI) Express, Infiniband, and others, are equally suitable. The chassis provides a port for an external communication bus for enabling communication between multiple chassis, directly or through a switch, and with client systems. The external communication may use a technology such as Ethernet, InfiniBand, Fibre Channel, etc. In some embodiments, the external communication bus uses different communication bus technologies for inter-chassis and client communication. If a switch is deployed within or between chassis, the switch may act as a translation between multiple protocols or technologies. When multiple chassis are connected to define a storage cluster, the storage cluster may be accessed by a client using either proprietary interfaces or standard interfaces such as network file system (NFS), common internet file system (CIFS), small computer system interface (SCSI) or hypertext transfer protocol (HTTP). Translation from the client protocol may occur at the switch, chassis external communication bus or within each storage node.

Each storage node may be one or more storage servers and each storage server is connected to one or more non-volatile solid state memory units, which may be referred to as storage units. One embodiment includes a single storage server in each storage node and between one to eight non-volatile solid state memory units, however this one example is not meant to be limiting. The storage server may include a processor, dynamic random access memory (DRAM) and interfaces for the internal communication bus and power distribution for each of the power buses. Inside the storage node, the interfaces and storage unit share a communication bus, e.g., PCI Express, in some embodiments. The non-volatile solid state memory units may directly access the internal communication bus interface through a storage node communication bus, or request the storage node to access the bus interface. The non-volatile solid state memory unit contains an embedded central processing unit (CPU), solid state storage controller, and a quantity of solid state mass storage, e.g., between 2-32 terabytes (TB) in some embodiments. An embedded volatile storage medium, such as DRAM, and an energy reserve apparatus are included in the non-volatile solid state memory unit. In some embodiments, the energy reserve apparatus is a capacitor, super-capacitor, or battery that enables transferring a subset of DRAM contents to a stable storage medium in the case of power loss. In some embodiments, the non-volatile solid state memory unit is constructed with a storage class memory, such as phase change or magnetoresistive random access memory (MRAM) that substitutes for DRAM and enables a reduced power hold-up apparatus.

Embodiments of a non-volatile solid-state storage with multiple operation queues and scheduling policies are discussed below. Some embodiments feature a controller that evaluates operations in operation queues according to the scheduling policies for improved system performance. Operations are selected based on the best benefit to the system in some embodiments. The system or storage grid may be a collection of storage nodes, storage units, etc. It should be appreciated that both global (system wide) and local information may be utilized to determine what is best, i.e., has the best benefit, whereas traditional solid state devices are limited to local knowledge. Each storage node has one or more non-volatile solid-state storages, each of which has non-volatile random-access memory (NVRAM) and flash memory. The non-volatile solid-state storage units apply various address spaces for storing user data. In some embodiments, an address space has sequential, nonrepeating addresses, as applied to medium addresses, segment addresses and/or virtual allocation units of the user data. Flash and NVRAM in general provide more parallelism opportunities relative to HDD at the channel level and within a channel. The embodiments described below take advantage of the increased parallelism opportunities as well as availability of global information.

FIG. 1 is a perspective view of a storage cluster 160, with multiple storage nodes 150 and internal solid-state memory coupled to each storage node to provide network attached storage or storage area network, in accordance with some embodiments. A network attached storage, storage area network, or a storage cluster, or other storage memory, could include one or more storage clusters 160, each having one or more storage nodes 150, in a flexible and reconfigurable arrangement of both the physical components and the amount of storage memory provided thereby. The storage cluster 160 is designed to fit in a rack, and one or more racks can be set up and populated as desired for the storage memory. The storage cluster 160 has a single chassis 138 having multiple slots 142. It should be appreciated that chassis 138 may be referred to as a housing, enclosure, or rack unit. In one embodiment, the chassis 138 has fourteen slots 142, although other numbers of slots are readily devised. For example, some embodiments have four slots, eight slots, sixteen slots, thirty-two slots, or other suitable number of slots. Each slot 142 can accommodate one storage node 150 in some embodiments. Chassis 138 includes flaps 148 that can be utilized to mount the chassis 138 on a rack. Fans 144 provide air circulation for cooling of the storage nodes 150 and components thereof, although other cooling components could be used, or an embodiment could be devised without cooling components. A switch fabric 146 couples storage nodes 150 within chassis 138 together and to a network for communication to the memory. In an embodiment depicted in FIG. 1, the slots 142 to the left of the switch fabric 146 and fans 144 are shown occupied by storage nodes 150, while the slots 142 to the right of the switch fabric 146 and fans 144 are empty and available for insertion of storage node 150 for illustrative purposes. This configuration is one example, and one or more storage nodes 150 could occupy the slots 142 in various further arrangements. The storage node arrangements need not be sequential or adjacent in some embodiments. Storage nodes 150 are hot pluggable, meaning that a storage node 150 can be inserted into a slot 142 in the chassis 138, or removed from a slot 142, without stopping or powering down the system. Upon insertion or removal of storage node 150 from slot 142, the system automatically reconfigures in order to recognize and adapt to the change. Reconfiguration, in some embodiments, includes restoring redundancy and/or rebalancing data or load.

Each storage node 150 can have multiple components. In the embodiment shown here, the storage node 150 includes a printed circuit board 158 populated by a CPU 156, i.e., processor, a memory 154 coupled to the CPU 156, and a non-volatile solid state storage 152 coupled to the CPU 156, although other mountings and/or components could be used in further embodiments. The memory 154 has instructions which are executed by the CPU 156 and/or data operated on by the CPU 156. As further explained below, the non-volatile solid state storage 152 includes flash or, in further embodiments, other types of solid-state memory.

Storage cluster 160 is scalable, meaning that storage capacity with non-uniform storage sizes is readily added, as described above. One or more storage nodes 150 can be plugged into or removed from each chassis and the storage cluster self-configures in some embodiments. Plug-in storage nodes 150, whether installed in a chassis as delivered or later added, can have different sizes. For example, in one embodiment a storage node 150 can have any multiple of 4 TB, e.g., 8 TB, 12 TB, 16 TB, 32 TB, etc. In further embodiments, a storage node 150 could have any multiple of other storage amounts or capacities. Storage capacity of each storage node 150 is broadcast, and influences decisions of how to stripe the data. For maximum storage efficiency, an embodiment can self-configure as wide as possible in the stripe, subject to a predetermined requirement of continued operation with loss of up to one, or up to two, non-volatile solid state storage units 152 or storage nodes 150 within the chassis.

Figure 2:
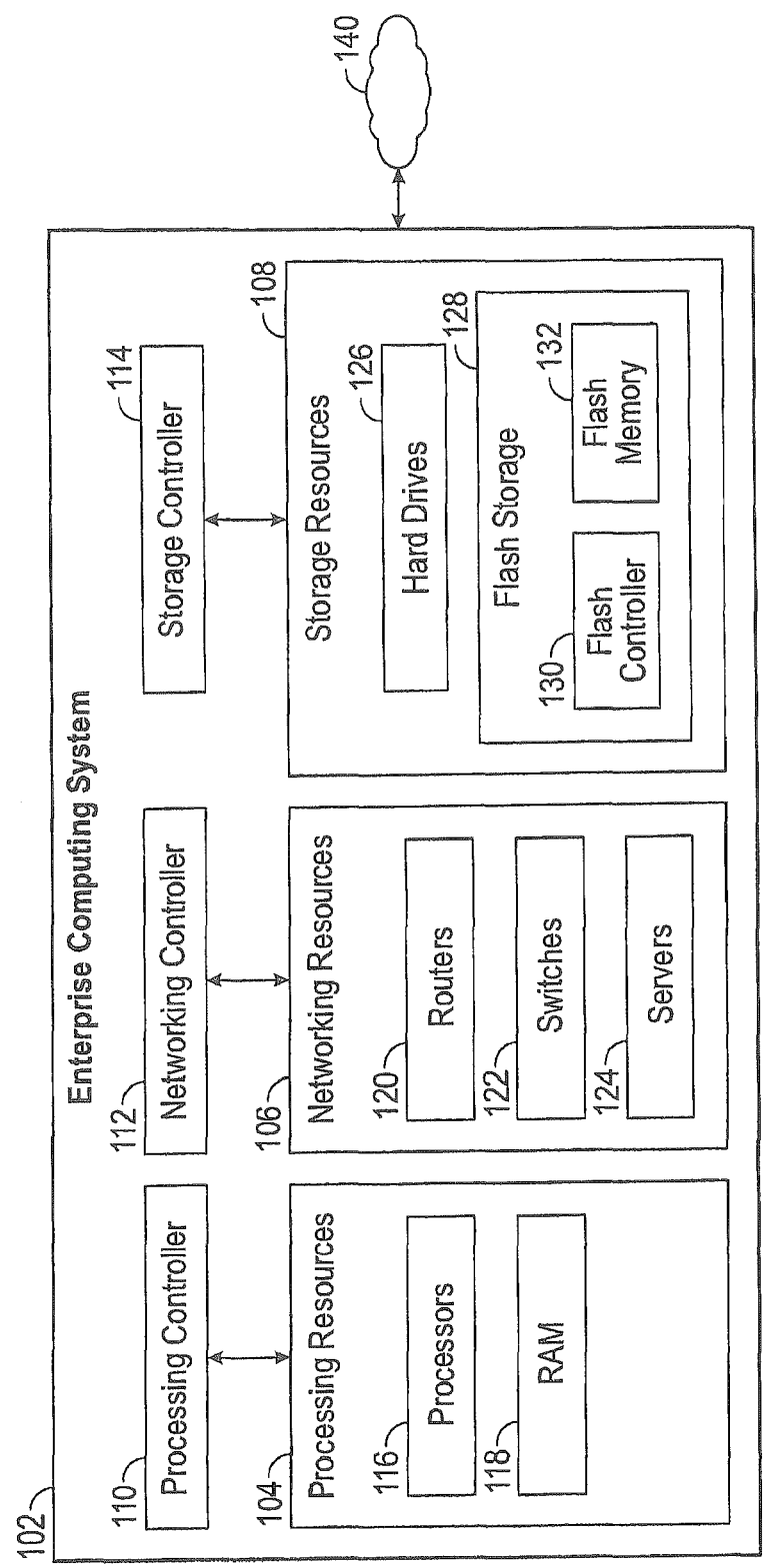
FIG. 2 is a system diagram of an enterprise computing system, which can use one or more of the storage clusters of FIG. 1 as a storage resource in some embodiments.

FIG. 2 is a system diagram of an enterprise computing system 102, which can use one or more of the storage nodes, storage clusters and/or non-volatile solid-state storage of FIG. 1 as a storage resource 108. For example, flash storage 128 of FIG. 2 may integrate the storage nodes, storage clusters and/or non-volatile solid-state storage of FIG. 1 in some embodiments. The enterprise computing system 102 has processing resources 104, networking resources 106 and storage resources 108, including flash storage 128. A flash controller 130 and flash memory 132 are included in the flash storage 128. In various embodiments, the flash storage 128 could include one or more storage nodes or storage clusters, with the flash controller 130 including the CPUs, and the flash memory 132 including the non-volatile solid-state storage of the storage nodes. In some embodiments flash memory 132 may include different types of flash memory or the same type of flash memory. The enterprise computing system 102 illustrates an environment suitable for deployment of the flash storage 128, although the flash storage 128 could be used in other computing systems or devices, larger or smaller, or in variations of the enterprise computing system 102, with fewer or additional resources. The enterprise computing system 102 can be coupled to a network 140, such as the Internet, in order to provide or make use of services. For example, the enterprise computing system 102 could provide cloud services, physical computing resources, or virtual computing services.

In the enterprise computing system 102, various resources are arranged and managed by various controllers. A processing controller 110 manages the processing resources 104, which include processors 116 and random-access memory (RAM) 118. Networking controller 112 manages the networking resources 106, which include routers 120, switches 122, and servers 124. A storage controller 114 manages storage resources 108, which include hard drives 126 and flash storage 128. Other types of processing resources, networking resources, and storage resources could be included with the embodiments. In some embodiments, the flash storage 128 completely replaces the hard drives 126. The enterprise computing system 102 can provide or allocate the various resources as physical computing resources, or in variations, as virtual computing resources supported by physical computing resources. For example, the various resources could be implemented using one or more servers executing software. Files or data objects, or other forms of data, are stored in the storage resources 108.

In various embodiments, an enterprise computing system 102 could include multiple racks populated by storage clusters, and these could be located in a single physical location such as in a cluster or a server farm. In other embodiments the multiple racks could be located at multiple physical locations such as in various cities, states or countries, connected by a network. Each of the racks, each of the storage clusters, each of the storage nodes, and each of the non-volatile solid-state storage could be individually configured with a respective amount of storage space, which is then reconfigurable independently of the others. Storage capacity can thus be flexibly added, upgraded, subtracted, recovered and/or reconfigured at each of the non-volatile solid-state storages. As mentioned previously, each storage node could implement one or more servers in some embodiments.

Figure 3:
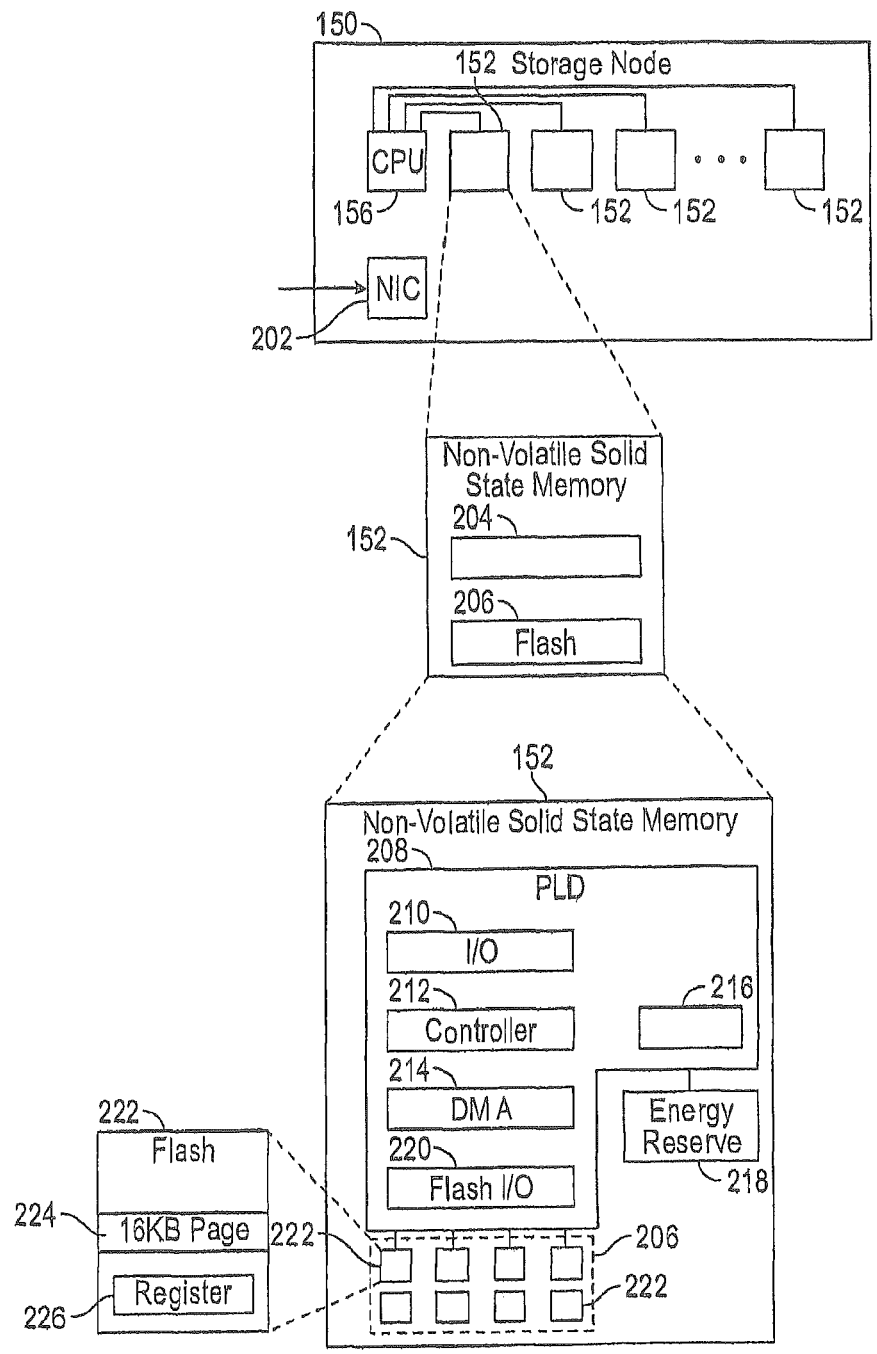
FIG. 3 is a multiple level block diagram, showing contents of a storage node and contents of one of the non-volatile solid-state storage units in accordance with some embodiments.

FIG. 3 is a multiple level block diagram, showing contents of a storage node 150 and contents of a non-volatile solid state storage 152 of the storage node 150. Data is communicated to and from the storage node 150 by a network interface controller (NIC) 202 in some embodiments. Each storage node 150 has a CPU 156, and one or more non-volatile solid state storage 152, as discussed above. Moving down one level in FIG. 3, each non-volatile solid state storage 152 has a relatively fast non-volatile solid state memory, such as nonvolatile random access memory (NVRAM) 204, and flash memory 206. In some embodiments, NVRAM 204 may be a component that does not require program/erase cycles (DRAM, MRAM, PCM), and can be a memory that can support being written vastly more often than the memory is read from. Moving down another level in FIG. 3, the NVRAM 204 is implemented in one embodiment as high speed volatile memory, such as dynamic random access memory (DRAM) 216, backed up by energy reserve 218. Energy reserve 218 provides sufficient electrical power to keep the DRAM 216 powered long enough for contents to be transferred to the flash memory 206 in the event of power failure. In some embodiments, energy reserve 218 is a capacitor, super-capacitor, battery, or other device, that supplies a suitable supply of energy sufficient to enable the transfer of the contents of DRAM 216 to a stable storage medium in the case of power loss. The flash memory 206 is implemented as multiple flash dies 222, which may be referred to as packages of flash dies 222 or an array of flash dies 222. It should be appreciated that the flash dies 222 could be packaged in any number of ways, with a single die per package, multiple dies per package (i.e. multichip packages), in hybrid packages, as bare dies on a printed circuit board or other substrate, as encapsulated dies, etc. In the embodiment shown, the non-volatile solid state storage 152 has a controller 212 or other processor, and an input output (I/O) port 210 coupled to the controller 212. I/O port 210 is coupled to the CPU 156 and/or the network interface controller 202 of the flash storage node 150. Flash input output (I/O) port 220 is coupled to the flash dies 222, and a direct memory access unit (DMA) 214 is coupled to the controller 212, the DRAM 216 and the flash dies 222. In the embodiment shown, the I/O port 210, controller 212, DMA unit 214 and flash I/O port 220 are implemented on a programmable logic device (PLD) 208, e.g., a field programmable gate array (FPGA). In this embodiment, each flash die 222 has pages, organized as sixteen kB (kilobyte) pages 224, and a register 226 through which data can be written to or read from the flash die 222. In further embodiments, other types of solid-state memory are used in place of, or in addition to flash memory illustrated within flash die 222.

In NVRAM 204, redundancy is not organized by segments but instead by messages, where each message (128 bytes to 128 kB) establishes its own data stripe, in some embodiments. NVRAM is maintained at the same redundancy as segment storage and operates within the same storage node groups in some embodiments. Because messages are stored individually the stripe width is determined both by message size and the storage cluster configuration. Larger messages may be more efficiently stored as wider strips.

Two of the many tasks of the CPU 156 on a storage node 150 are to break up write data, and reassemble read data. When the system has determined that data is to be written, an authority for that data is located in one of the non-volatile solid-state storages 152. The authority may be embodied as metadata, including one or more lists such as lists of data segments which the nonvolatile solid-state storage 152 manages. When a segment ID for data is already determined the request to write is forwarded to the non-volatile solid-state storage 152 currently determined to be the host of the authority determined from the segment. The host CPU 156 of the storage node 150, on which the non-volatile solid-state storage 152 and corresponding authority reside, then breaks up or shards the data and transmits the data out to various non-volatile solid-state storage 152. The transmitted data is written as a data stripe in accordance with an erasure coding scheme. In some embodiments, data is requested to be pulled, and in other embodiments, data is pushed. In reverse, when data is read, the authority for the segment ID containing the data is located as described above. The host CPU 156 of the storage node 150 on which the non-volatile solid-state storage 152 and corresponding authority reside requests the data from the non-volatile solid-state storage and corresponding storage nodes pointed to by the authority. In some embodiments the data is read from flash storage as a data stripe. The host CPU 156 of storage node 150 then reassembles the read data, correcting any errors (if present) according to the appropriate erasure coding scheme, and forwards the reassembled data to the network. In further embodiments, some or all of these tasks can be handled in the non-volatile solid-state storage 152. In some embodiments, the segment host requests the data be sent to storage node 150 by requesting pages from storage and then sending the data to the storage node making the original request.

In some systems, for example in UNIX-style file systems, data is handled with an index node or inode, which specifies a data structure that represents an object in a file system. The object could be a file or a directory, for example. Metadata may accompany the object, as attributes such as permission data and a creation timestamp, among other attributes. A segment number could be assigned to all or a portion of such an object in a file system. In other systems, data segments are handled with a segment number assigned elsewhere. For purposes of discussion, the unit of distribution is an entity, and an entity can be a file, a directory or a segment. That is, entities are units of data or metadata stored by a storage system. Entities are grouped into sets called authorities. Each authority has an authority owner, which is a storage node that has the exclusive right to update the entities in the authority. In other words, a storage node contains the authority, and that the authority, in turn, contains entities.

A segment is a logical container of data in accordance with some embodiments. A segment may be an address space between medium address space and physical flash locations. Each data segment is protected, e.g., from memory and other failures, by breaking the segment into a number of data and parity shards, where applicable. The data and parity shards are distributed, i.e., striped, across non-volatile solid-state storages 152 coupled to the host CPUs 156 in accordance with an erasure coding scheme. Usage of the term segments refers to the container and its place in the address space of segments in some embodiments. Usage of the term stripe refers to the same set of shards as a segment and includes how the shards are distributed along with redundancy or parity information in accordance with some embodiments.

A series of address-space transformations takes place across an entire storage system. At the top is the inode address space, which the filesystem uses to translate file paths to inode IDs (Identifications). Inodes point into medium address space, where data is logically stored. Medium addresses are mapped into segment address space. Segment addresses are then translated into physical flash locations. Physical flash locations have an address range bounded by the amount of flash in the system in accordance with some embodiments. Medium addresses and segment addresses are logical containers, and in some embodiments use a 128 bit or larger identifier so as to be practically infinite, with a likelihood of reuse calculated as longer than the expected life of the system. Addresses from logical containers are allocated in a hierarchical fashion in some embodiments. Initially, each non-volatile solid-state storage 152 may be assigned a range of address space. Within this assigned range, the non-volatile solid-state storage 152 is able to allocate addresses without synchronization with other non-volatile solid-state storage 152.

Data and metadata are stored by a set of underlying storage layouts that are optimized for varying workload patterns and storage devices. These layouts incorporate multiple redundancy schemes, compression formats and index algorithms. Some of these layouts store information about authorities and authority masters, while others store file metadata and file data. The redundancy schemes include error correction codes that tolerate corrupted bits within a single storage device (such as a NAND flash chip), erasure codes that tolerate the failure of multiple storage nodes, and replication schemes that tolerate data center or regional failures. In some embodiments, low density parity check (LDPC) code is used within a single storage unit. Data is not further replicated within a storage cluster, as it is assumed a storage cluster may fail. Reed-Solomon encoding is used within a storage cluster, and mirroring is used within a storage grid in some embodiments. Metadata may be stored using an ordered log structured index (such as a Log Structured Merge Tree), and large data may be stored in an unordered log structured layout (similar to log structured file systems).

Figure 4:
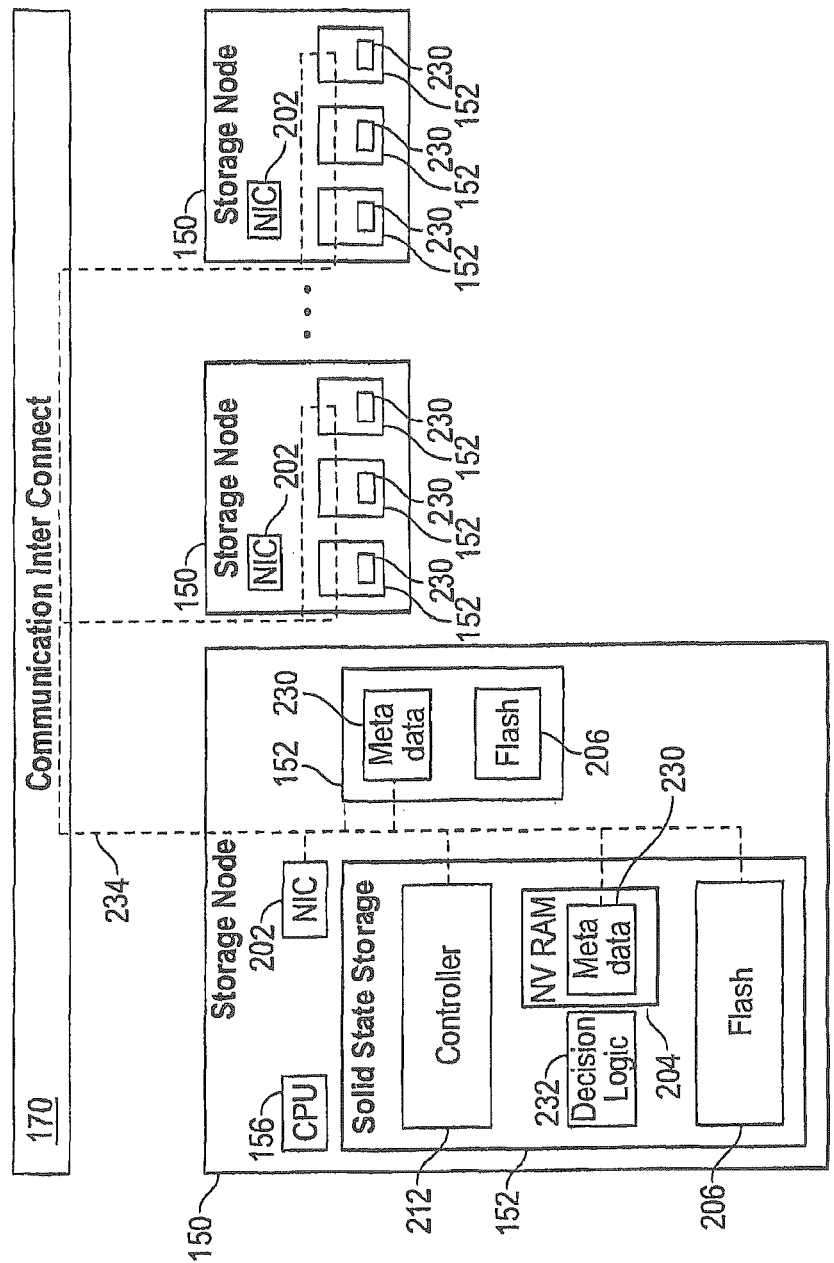
FIG. 4 is a block diagram showing a communication path for redundant copies of metadata, with further details of storage nodes and solid-state storages in accordance with some embodiments.

FIG. 4 is a block diagram showing a communication path 234 for redundant copies of metadata 230, with further details of flash storage nodes 150 (i.e., storage nodes 150 having flash memory) and non-volatile solid-state storages 152 in accordance with some embodiments. Metadata 230 includes information about the user data that is written to or read from the flash memory 206. Metadata 230 can include messages, or derivations from the messages, indicating actions to be taken or actions that have taken place involving the data that is written to or read from the flash memory 206. Distributing redundant copies of metadata 230 to the non-volatile solid-state storage units 152 through the communication interconnect 170 ensures that messages are persisted and can survive various types of failure the system may experience. Each non-volatile solid-state storage 152 dedicates a portion of the NVRAM 204 to storing metadata 230. In some embodiments, redundant copies of metadata 230 are stored in the additional non-volatile solid-state storage 152.

Flash storage nodes 150 are coupled via the communication interconnect 170. More specifically, the network interface controller 202 of each storage node 150 in the storage cluster is coupled to the communication interconnect 170, providing a communication path 234 among storage nodes 150 and non-volatile solid-state storage 152. Storage nodes 150 have one or more non-volatile solid-state storage units 152. Non-volatile solid-state storage units 152 internal to a storage node can communicate with each other, for example via a bus, a serial communication path, a network path or other communication path 234 as readily devised in accordance with the embodiments disclosed herein. Communication interconnect 170 can be included in or implemented with the switch fabric of FIG. 1 in some embodiments. Storage nodes 150 of FIG. 4 form a storage cluster that is enclosed within a single chassis that has an internal power distribution bus within the chassis as described with reference to FIG. 1.

Referring to FIGS. 3 and 4, in case of a power failure, whether local to non-volatile solid-state storage 152 or a storage node 150, data can be copied from the NVRAM 204 to the flash memory 206. For example, the DMA unit 214 of FIG. 3 can copy contents of the NVRAM 204, including the metadata, to the flash memory 206, using power supplied by the energy reserve 218. Energy reserve 218 is sized with sufficient capacity to support copy operation. That is, the energy reserve 218 should be sized so as to provide sufficient current at a sufficient voltage level for a time duration long enough to complete the copying so that messages that are in metadata 230 are persisted in the flash memory 206.

A further mechanism for persisting messages in a storage system involves the communication path 234 described above in FIG. 4. Redundant copies of the metadata 230 can be distributed via the communication path 234, in various ways. For example, a message coming from the filesystem could be distributed via the communication interconnect 170 as a broadcast over the communication path 234 to all of the non-volatile solid-state storages 152. A non-volatile solid-state storage 152 could send a copy of metadata 230 over the communication path 234 to other non-volatile solid-state storage 152 in a storage node 150. CPU 156 on a storage node 150, receiving a message from the communication interconnect 170 via the network interface controller 202 could send a copy of the message to each solid-state storage 152. The CPU 156 may rebroadcast the message to other flash storage nodes 150, and the flash storage nodes 150 could then distribute the message to the solid-state storages 152 in each of these flash storage nodes 150 in some embodiments. In these and other uses of the communication path 234, redundant copies of the metadata 230 can be distributed to the non-volatile solid-state storages 152. Then, if one non-volatile solid-state storage 152, or one storage node 150 experiences a failure, redundant copies of any message are available in metadata 230 of at least one other non-volatile solid-state storage 152. Each non-volatile solid-state storage 152 can apply decision logic 232 when evaluating various situations such as local power failure, an unreachable node, or instructions to consider or commence a data recovery or a data rebuild. The decision logic 232 includes witnessing logic, voting logic, consensus logic and/or other types of decision logic in various embodiments. Decision logic 232 could be implemented in hardware, software executing on the controller 212, firmware, or combinations thereof, and could be implemented as part of the controller 212 or coupled to the controller 212. The decision logic 232 is employed in consensus decisions among multiple solid-state storage units 152, in some embodiments. In further embodiments, the decision logic 232 could cooperate with the other non-volatile solid-state storage units 152 in order to gather copies of the redundant metadata 230, and make local decisions. The mechanisms for persisting messages in a storage system are useful in the event of a failure, and can be used in data recovery and reconstruction as described above.

Examples of messages include a request to write data, a request to read data, a request to lock or unlock a file, a change in permission of a file, an update to a file allocation table or other file or directory structure, a request to write a file that has executable instructions or to write a file name that is reserved and interpreted as an executable direction, updates to one or more authorities, updates to a fingerprint table, list or other data used in deduplication, updates to hash tables, updates to logs, and so on. When a message is received in non-volatile solid-state storage 152 of a storage node 150, indicating some action has taken place, the message or a derivation of the message is stored as metadata 230 in the NVRAM 204 of that solid-state storage 152. By applying the redundant copies of the metadata 230, actions are captured that are in progress, so that if a failure happens, these actions can be replayed and replacement actions can then be performed, for example upon restart. Actions span storage nodes and use cluster messaging, so the act of sending a message can be made persistent data via one or more of the mechanisms for persisting messages. These mechanisms address some of the known failure scenarios in order to ensure availability of data. In some embodiments, the messages don't require permanence beyond completion of the actions. In other embodiments the messages are further retained to facilitate rollback or other recovery operations.

For example, if a command is sent out to carry out a write operation, this message is recorded and redundant. If there is a failure, it can be determined whether or not that action has been carried out, and whether or not the action should be driven to completion. Such determination can be carried out using the decision logic 232 in each non-volatile solid-state storage 152. There is dedicated storage in NVRAM 204 for messages and other metadata 230, so that messages are recorded in the non-volatile solid-state storage 152 and replicated in some embodiments. The messages and other metadata 230 are written into flash memory 206 if one non-volatile solid-state storage 152 experiences a power failure, or if the entire system experiences a power failure or otherwise shuts down. The redundancy level of the messages matches the redundancy level of the metadata in some embodiments. When there are sufficient numbers of copies of messages, the message becomes irrevocable. If one node goes down, other nodes can vote, achieve consensus, or witness the various copies of the message and determine what action, if any, to carry to completion. If the entire system goes down, e.g., through a global power failure, then a sufficient number of these messages get written from NVRAM 204 to flash memory 206. Upon restoration of power, the nodes can again open copies of the message and determine what action, if any, to carry to completion to prevent any corruption.

With continued reference to FIGS. 3 and 4, storage node 150 of a storage cluster 160 includes two levels of controllers. There is a host CPU 156 in the storage node 150, and there is a controller 212 in the non-volatile solid-state storage 152. The controller 212 can be considered a flash memory controller, which serves as a bridge between the host CPU 156 and the flash memory 206. Each of these controllers, namely the host CPU 156 and the flash controller 212, can be implemented as one or more processors or controllers of various types from various manufacturers. The host CPU 156 can access both the flash memory 206 and the NVRAM 204 as distinct resources, with each being independently (i.e., individually) addressable by the host CPU 156.

By separating the NVRAM 204 and the flash memory 206 into distinct resources, not all data placed in the NVRAM 204 must be written to the flash memory 206. The NVRAM 204 can also be employed for various functions and purposes. For example, updates to the NVRAM 204 can be made obsolete by newer updates to the NVRAM 204. A later transfer of user data from the NVRAM 204 to the flash memory 206 can transfer the updated user data, without transferring the obsolete user data to the flash memory 206. This reduces the number of erasure cycles of the flash memory 206, reduces wear on the flash memory 206, and moves data more efficiently. The CPU 156 can write to the NVRAM 204 at a smaller granularity than the granularity of the transfers from the NVRAM 204 to the flash memory 206. For example, the CPU 156 could perform 4 kB writes to the NVRAM 204, and the DMA unit 214 could perform a page write of 16 kB from the NVRAM 204 to the flash memory 206 under direction of the controller 212. The ability to collect multiple writes of user data to the NVRAM 204 prior to writing the user data from the NVRAM 204 to the flash memory 206 increases writing efficiency. In some embodiments, a client write of user data is acknowledged at the point at which the user data is written to the NVRAM 204. Since the energy reserve 218, described above with reference to FIG. 3, provides sufficient power for a transfer of contents of the NVRAM 204 to the flash memory 206, the acknowledgment of the client write does not need to wait until the user data is written to the flash memory 206.

As further examples of differences between present embodiments and previous solid-state drives, the metadata 230 in the NVRAM 204 is not written into the flash memory 206, except in cases of power loss. Here, a portion of the NVRAM 204 acts as a workspace for the CPU 156 of the storage node 150 to apply the metadata 230. The CPU 156 of the storage node 150 can write to the NVRAM 204 and read the NVRAM 204, in order to access the metadata 230. The CPU 156 is responsible for migrating data from the NVRAM 204 down to the flash memory 206 in one embodiment. Transfer from the NVRAM 204 to the flash memory 206 is not automatic and predetermined, in such embodiments. Transfer waits until there is sufficient user data in the NVRAM 204 for a page write to the flash memory 206, as determined by the CPU 156 and directed to the DMA unit 214. The DMA unit 214 can be further involved in the path of the user data. In some embodiments, the DMA unit 214 (also known as a DMA engine) is designed to detect and understand various data formats. The DMA unit 214 can perform a cyclic redundancy check (CRC) calculation to check the integrity of the user data. In some embodiments, the DMA unit 214 inserts the CRC calculation into the data and verifies that the data is consistent with a previously inserted CRC calculation.

Work may be offloaded to the controller 212 of the non-volatile solid-state storage 152. Processing that is offloaded to flash controller 212 can be co-designed with processing performed by the CPU 156 of the storage node 150. Various mapping tables that translate from one address space to another, e.g., index trees or address translation tables, can be managed within the non-volatile solid-state storage 152, in some embodiments. The controller 212 of the non-volatile solid-state storage 152 can perform various tasks such as looking through these mapping tables, finding metadata associated with the mapping tables, and determining physical addresses, e.g., for user data sought by the CPU 156 of the storage node 150. In order to find an authority associated with a segment number, a standard solid-state drive might bring back an entire 16 kB flash page, and the CPU 156 would search in this page. In some embodiments, the controller 212 of the non-volatile solid-state storage 152 can perform this search much more efficiently, and pass the results to the CPU 156 of the storage node 150, without sending back the entire flash page to the CPU 156.

Figure 5:
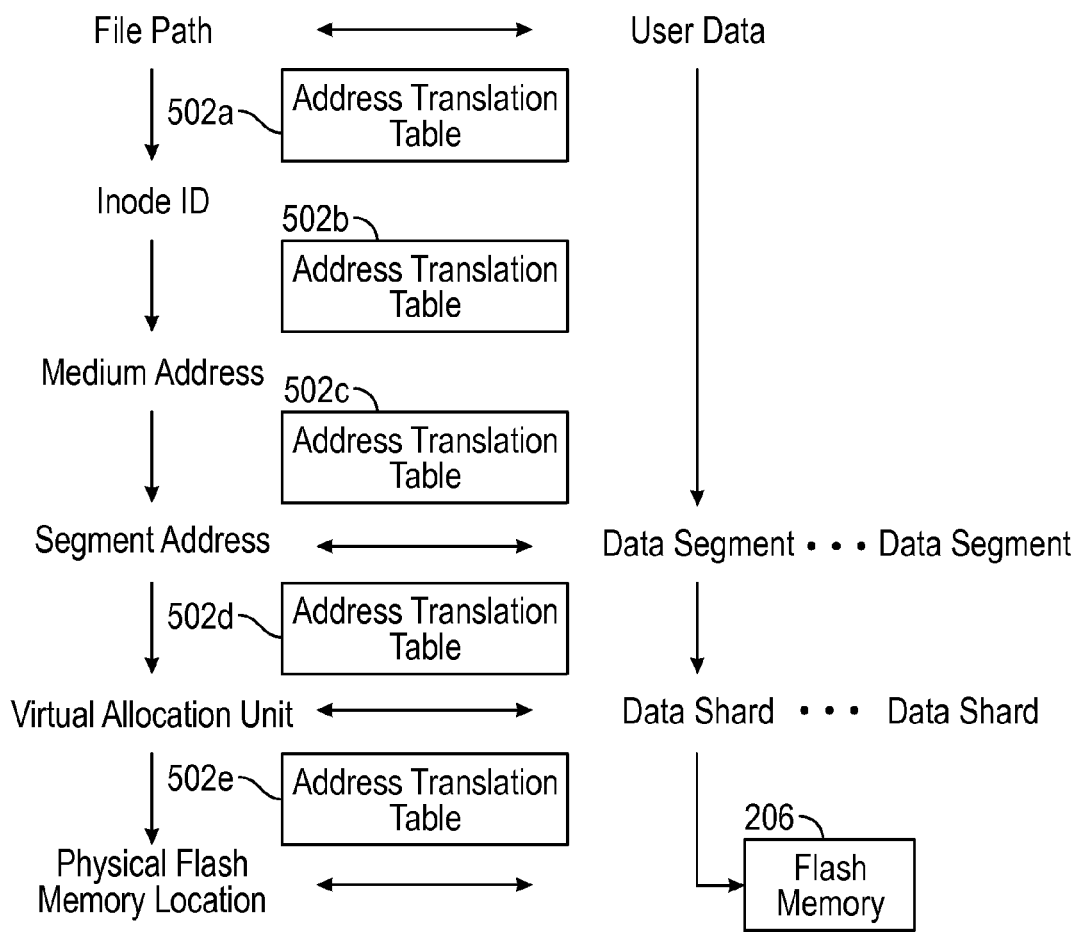
FIG. 5 is an address and data diagram showing address translation as applied to user data being stored in a non-volatile solid-state storage in some embodiments.

FIG. 5 is an address and data diagram showing address translation as applied to user data being stored in an embodiment of a non-volatile solid-state storage 152. In some embodiments, one or more of the address translations applies an address space having sequential, nonrepeating addresses. User data, arriving for storage in a storage cluster, is associated with a file path according to a file system. The user data is separated into data segments, each of which is assigned a segment address. Each data segment is separated into data shards, each of which is stored in flash memory 206. Various address translation tables 502 (e.g., mapping tables) are applied by either the CPU of the storage node or the controller of the non-volatile solid-state storage to translate, track and assign addresses to the user data and portions thereof.

These address translation tables 502 reside as metadata in the memory 154 (See FIG. 1) of the storage node, the NVRAM 204 of the non-volatile solid-state storage, and/or the flash memory of the non-volatile solid-state storage, in various embodiments. Generally, address translation tables 502 that occur later in the chain of translations have a greater number of entries (e.g., address translation tables 502D and 502E) and should be located in the flash memory 206, as there may not be sufficient memory space for these in the NVRAM or the memory 154. Further, messages regarding updates to the tables 502, or derivations of these messages, could be stored as metadata in the above-described memories. Metadata in one or more of these locations can be subjected to replication (i.e., redundancy) and decisions for various degrees of fault tolerance and system recovery, as described above.

For a particular portion of user data, the file path is translated or mapped to an inode ID with use of an address translation table 502A. This may be in accordance with a filesystem, and could be performed by the CPU of the storage node in some embodiments. The inode ID is translated or mapped to a medium address with use of an address translation table 502B, which could be performed by CPU. In some embodiments, the medium address, which is in a medium address space, is included as one of the sequential nonrepeating addresses. The medium address is translated or mapped to the segment address, with use of an address translation table 502C through the CPU in some embodiments. The segment address, which is in a segment address space, may be included as one of the sequential nonrepeating addresses. The segment address, as assigned to the data segment, is translated to a virtual allocation unit, as assigned to the data shard, with use of an address translation table 502D. Controller 212 of the non-volatile solid-state storage may perform this translation by accessing address translation table 502D in the flash memory 206. The virtual allocation unit is translated to a physical flash memory location with the use of an address translation table 502E. The physical flash memory location may be assigned to the data shard.

The address space with the sequential nonrepeating addresses may be applied to the medium address space, the segment address space and/or the virtual allocation unit address space in various embodiments. In each case, a range of addresses from the address space is assigned to each of the non-volatile solid-state storages in a storage cluster, or to each of the storage nodes in a storage cluster. The ranges may be non-overlapping, such that each non-volatile solid-state storage unit is assigned a range that differs from the ranges of the other non-volatile solid-state storage units. In this mechanism, no address from this address space repeats anywhere in the storage cluster. That is, each address from this address space is unique, and no two portions of user data are assigned the same address from this address space, during the expected lifespan of the system. Each time one of the addresses from this address space is assigned to a portion of user data in a non-volatile solid-state storage unit, whether the address is a medium address, a segment address, or a virtual allocation unit, the address (upon assignment) should be greater than all such addresses previously assigned in that non-volatile solid-state storage unit. Thus, the addresses may be referred to as sequential, nonrepeating in this address space. The address space with these properties could include the medium address space, the segment address space and/or the virtual allocation unit address space. A non-volatile solid-state storage unit can allocate the assigned range of addresses in the non-volatile solid-state storage without synchronization with other non-volatile solid-state storage units in a storage cluster.

Each range of the address space has upper and lower bounds in some embodiments. Overall, the address space has an upper bound that exceeds the likely maximum address that would be assigned during the expected lifespan of a system.

In one embodiment, the sequential nonrepeating addresses in the address space are binary numbers with at least 128 bits. The amount of bits may vary in embodiments, however with 128 bits, two raised to the $128^{th}$ power is greater than the expected maximum address occurring for the lifetime of the system. The upper bound of the address space is greater than or equal to this number, or could include or be this number, in some embodiments. Larger numbers could be applied as technology further advances to higher operating speeds and lower time delays for reading and/or writing. The lower bound of the address space could be zero or one, or some other suitable low number.

Applying the sequential nonrepeating addresses to one or more of the medium addresses, the segment addresses, or the virtual allocation units, enhance data recovery and flash writes. In some embodiments, the storage cluster, the storage node or the non-volatile, solid-state storage unit performs a snapshot of the present contents of the cluster, the storage node, or the non-volatile solid-state storage unit. At a later time, a particular version of user data can be recovered by referring to the snapshot. Since the relevant addresses do not have duplicates, there is an unambiguous record of the version of the user data at the time of the snapshot, and data is readily recovered if still existing in the relevant memory. Formats for snapshots are readily devised, and may include a file with a record of the contents of the cluster, the storage node, or the non-volatile solid-state storage unit, applying one or more address schemes. Depending on which address scheme or schemes is present in the snapshot, the address translation tables 502A, 502B, 502C, 502D, 502E can be applied to determine physical flash memory locations and presence or absence in the flash memory 206 of the desired data for recovery.

For flash writes, in some embodiments blocks of flash pages 224 are erased, and then individual flash pages 224 (see FIG. 3) are written in sequential order within a single erased block. This operation is supported by the above-described addressing mechanism, which assigns sequentially increasing addresses to data segments and/or data shards as they arrive for storage. In some embodiments, information relating to the medium address, the segment address, and/or the virtual allocation unit is written to a header of the flash page 224, thus identifying data stored in the flash page 224 (e.g., as data shards). The flash page 224, in such embodiments, becomes self-describing and self-checking, via the information in the header.

Figure 6:
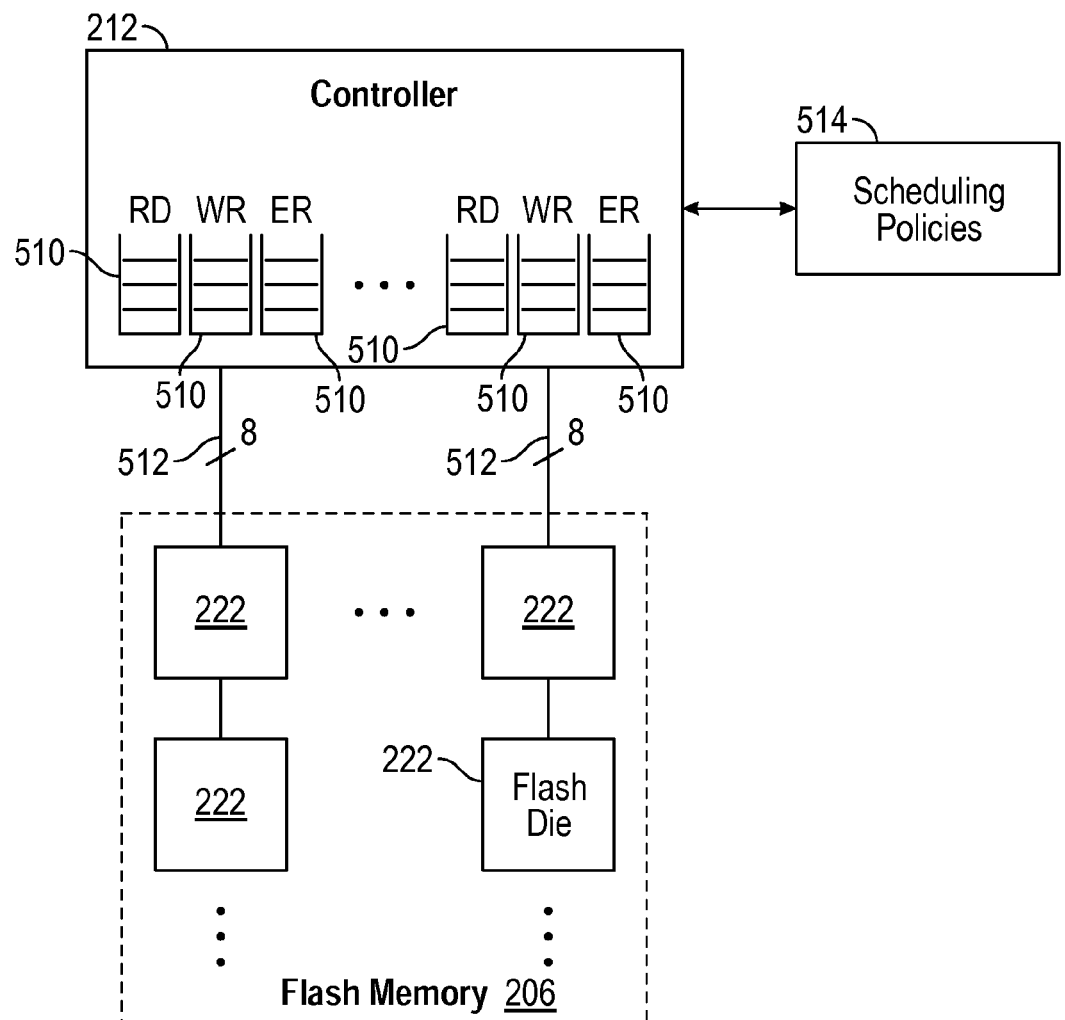
FIG. 6 is a block diagram of a controller with operation queues coupled to flash memory in accordance with some embodiments.

FIG. 6 is a block diagram of a controller 212 with operation queues 510 coupled to flash memory 206 in an embodiment of a non-volatile solid-state storage unit, operating according to scheduling policies 514. The scheduling policies 514 are employed by the controller 212 to prioritize operations in the operation queues 510. As described above with reference to FIG. 3, the flash memory 206 has multiple flash dies 222, shown here organized into channels. Each channel has a channel bus 512, which is eight bits wide in the embodiment shown, but could have other widths in further embodiments. Each channel, and channel bus 512, is associated with multiple operation queues 510. Each channel bus 512 couples multiple operation queues 510 to multiple flash dies 222. The operation queues 510 include read queues, write queues, and erase queues, and may include further queues organized according to traffic classes or other classes. Traffic classes could include read operations and write operations relating to user data, metadata, address tables and further system data and operations. In various embodiments, the operation queues 510 are implemented in hardware, firmware, software and memory, or various combinations thereof.

The controller 212 of FIG. 6 receives requests for operations, and places (i.e., deposits or writes) the operations into the operation queues 510. The operations may be sorted according to operation classes, or channels, or both. For example, the controller 212 could receive these requests for operations as messages passed down from the CPU of the storage node to the non-volatile solid-state storage. Operations typically include reading data, writing data, or erasing (e.g., a block of flash), although further operations at higher or lower level could be performed. Operations are overlapped for high throughput to and from the flash memory 206. In order to increase efficiency and prevent conflicts, scheduling policies 514 are adopted. These scheduling policies 514 can be held in a memory in or coupled to the controller 212, and can have various formats as readily devised. In some embodiments, versions of flash memory 206 allow interruptible writes or interruptible erases, which may allow a different set of scheduling policies 514.

Still referring to FIG. 6, the controller 212 evaluates operations waiting in the operation queues 510 as to benefits to the system. That is, the controller 212 determines a relative benefit for each of the operations in accordance with the scheduling policies 514 in some embodiments. In one embodiment, the controller 212 weights the operations, i.e., assigns a weighting value to each of the operations in the operation queues 510 based on the operation and the scheduling policies 514. The operation queues 510 contain sufficient memory to have these weights written adjacent to the operations in the queues 510. Weighting scales with increasing or decreasing values to represent greater benefit, ranges of weighting values, and further mechanisms for evaluating, weighting, or associating weights and operations are readily devised.

For each of the channels of FIG. 6, the controller 212 selects or determines an operation from the operation queues 510 that has a greater benefit than other operations in the operation queues 510. It may be preferable to pick an operation with a maximum benefit, but there also may be operations with equal or approximately equal benefits, and some tie-breaking algorithm could be employed. In some embodiments it may also be expedient to pick an operation with a locally maximum benefit, without examining all of the operations in all of the queues 510, or without finding a globally maximum benefit. This may be an iterative process, with the controller 212 evaluating operations, selecting operations, and executing operations. In various embodiments, the controller 212 selects the next operation from the operation queues 510 for each of the channels in various manners. In one embodiment, the controller 212 selects an operation from among operations at the heads of the operation queues 510. In other embodiments, the controller 212 selects an operation from anywhere in the operation queues coupled to each channel, e.g., operations out of sequence relative to the queues 510.

One type of scheduling policy 514 of FIG. 6 is to perform the quickest operation or shortest job first, i.e., execute first the operation that consumes the least amount of time. This policy is based on expected execution time. For example, a write operation could take from 1 to 3 milliseconds (ms), depending on whether the write is to an odd or an even page in the flash memory 206. As a further example, read operations could vary between 100 micro seconds ($\mu$s) and 500 $\mu$s, which may be page dependent. Block erases of flash memory 206 typically take a longer amount of time than either the reads or the writes. An interruptible write, or interruptible erase, could be paused in order to perform a more beneficial write, or a read with a greater benefit value. An erase, even if the erase takes a long time, should be performed at high priority if failing to do so results in running out of storage capacity for new writes.

An aging mechanism is employed in some embodiments, in order to prevent operations from stagnating in the queues 510. For example, without an aging mechanism, an operation having a low system benefit could remain for too long in a queue 510. In these embodiments, an aging parameter could be employed that increases in value (i.e., indicates a greater benefit) the longer an operation remains in a queue 510. Each location in each queue 510 could have an aging parameter, such as a timestamp or a value that increments with each evaluation cycle, associated with the operation at that location. The weighting could take the aging parameter into account. In some embodiments, this aging is accounted for in the scheduling policies 514. The data may be explicitly tagged in some embodiments. For example, tags could indicate that an inode number or identifier is being accessed, or a medium address is being accessed. Tags indicating priority could be attached by a file system based on analytics performed in the inode or medium layer. In some embodiments, tags could indicate levels of priority assigned elsewhere in the system. A tag may indicate a client critical path, which should be given a high priority and high relative benefit. In embodiments with tags, the scheduling policies 514 may relate at least in part to the tags.

In some embodiments, some or all operations are not explicitly tagged. In such cases, a determination of relative benefit to the system could be according to the address and/or the content of data associated with the operation. Garbage collection may involve read and write operations, to move data out of an area so that a block can be reclaimed in flash memory 206. The operations involved with garbage collection could be given lower weighting than reads or writes of user data requested by a client. This determination could be based on tags as above, or could be based on addresses. Increasing addresses, within a bounded address space, may be assigned to newly arriving data write operations. Thus, garbage collection read and write operations would tend to have lower numbered addresses than newly arriving data write operations. A lower benefit could be accorded to the garbage collection read and write operations, based on the addresses of the garbage collection read and write operations. A higher benefit could be accorded to the newly arriving data write operations, based on the addresses of the newly arriving data write operations.

A list of policies which could be included in various combinations in the scheduling policies 514 is provided. This list is not exhaustive, in any particular precedence order, and should not be considered limiting to the embodiments as further policies, expressions of the policies, and formats for the policies are readily devised in accordance with the teachings herein.

a) Writing user data per client request has higher benefit than a data write resulting from garbage collection.
   b) Reading user data per client request has higher benefit than a data read resulting from garbage collection.
   c) Reading user data has higher benefit than erasing.
   d) Writing user data has higher benefit than erasing.
   e) Erasing has highest benefit if the erasing prevents having insufficient storage capacity for new writes.
   f) Data writes having shorter latency have higher benefit than data writes having longer latency.
   g) Data reads having shorter latency have higher benefit than data reads having longer latency.
   h) Data reads or writes on an indicated client critical path have higher benefit than data reads or writes not on an indicated client critical path.
   i) A data write operation that has been in a queue for a longer time has greater benefit than a data write operation that has been in a queue for a shorter time.
   j) A data read operation that has been in a queue for a longer time has greater benefit than a data read operation that has been in a queue for a shorter time.

The embodiments described above may be applied across queues as well as across queues of different devices. Thus, the policies have a local component for the solid state device associated with the queue and a global component associated with different devices of the system or storage grid. In some embodiments, reads, writes or erases or any other operations in general from different queues may be prioritized based on a logical age of the operation or other characteristics. The embodiments encompass intra-scheduling options within a device or storage unit and inter-scheduling options that extend across multiple devices or storage units.

Figure 7:
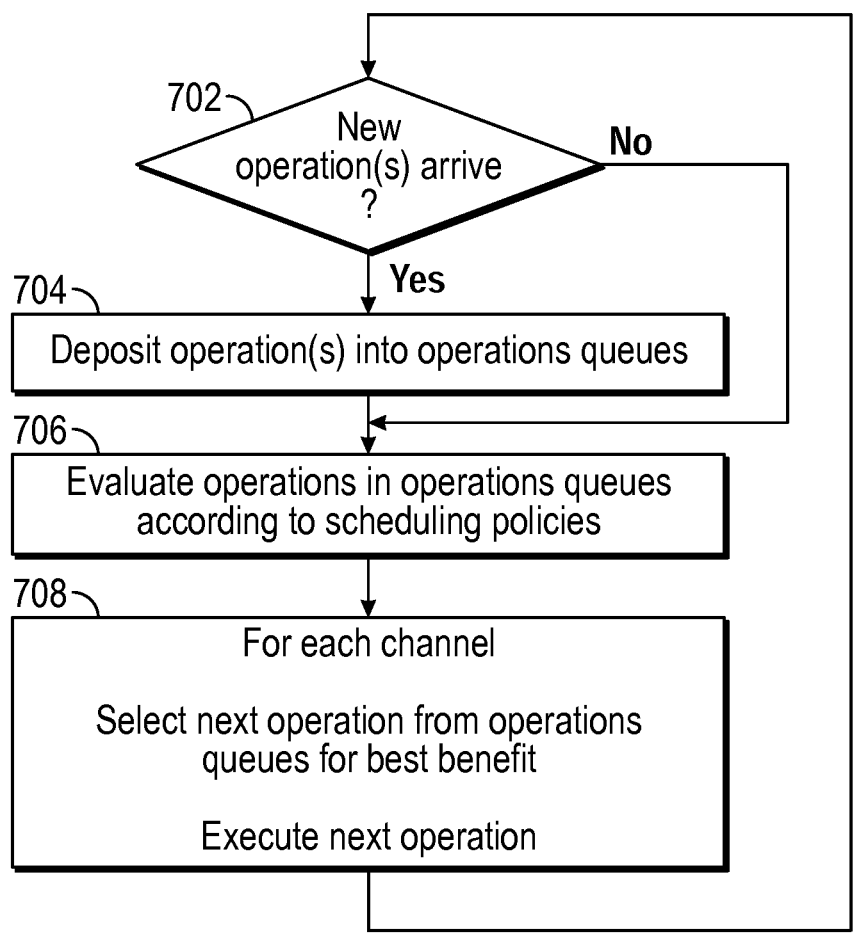
FIG. 7 is a flow diagram of a method for applying scheduling policies to a non-volatile solid-state storage in accordance with some embodiments.

FIG. 7 is a flow diagram of a method for applying scheduling policies, which can be practiced on or by various storage clusters, storage nodes and/or non-volatile solid-state storage units in accordance with some embodiments. The method is suitable for a controller coupled to flash memory in some embodiments. The method initiates with decision action 702, where it is determined if a new operation (or operations) is arriving. The operation could include a read operation, a write operation, or an erase operation, directed to flash memory. The operation could be arriving as a message from the storage node to a non-volatile solid-state storage. If the answer is no, flow branches to the action 706. If the answer is yes, flow proceeds to the action 704. In the action 704, the operation is deposited into operation queues. In an action 706, the operations in the operation queues are evaluated according to scheduling policies. The evaluation establishes relative benefits of the operations, in various manners as described above. In an action 708, for each channel, the next operation is selected from the operation queues, for best benefit according to the evaluation. Selection of the next operation is in accordance with results of the evaluation. Action 708 could be implemented as an iterative loop, a multithreaded operation, or a parallel processing operation, in various embodiments. Flow proceeds back to the action 702, in order to determine if new operations are arriving.

Figure 8:
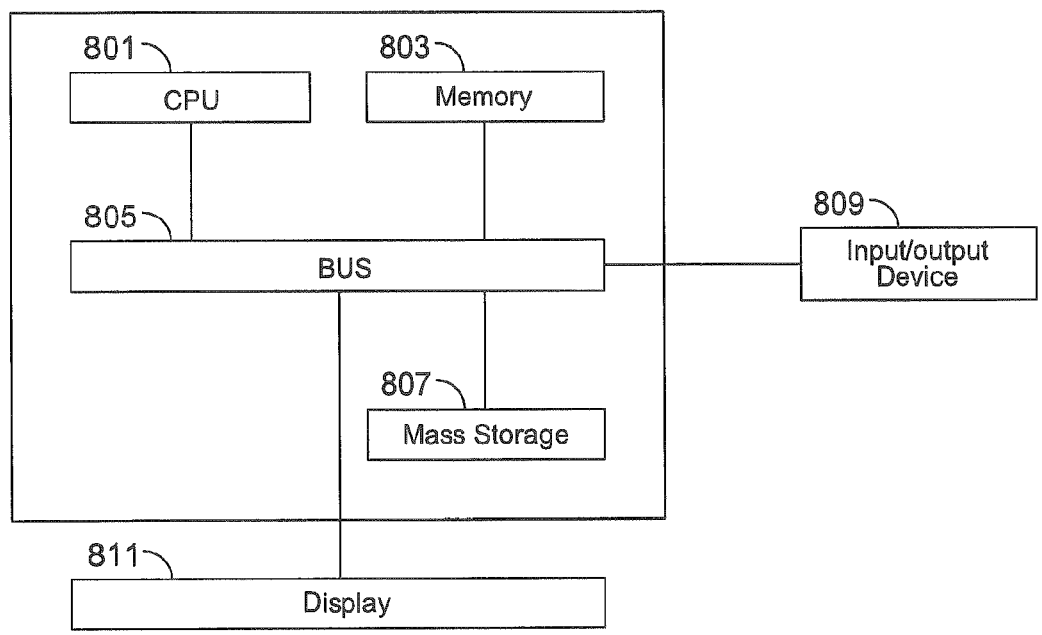
FIG. 8 is an illustration showing an exemplary computing device which may implement the embodiments described herein.

It should be appreciated that the methods described herein may be performed with a digital processing system, such as a conventional, general-purpose computer system. Special purpose computers, which are designed or programmed to perform only one function may be used in the alternative. FIG. 8 is an illustration showing an exemplary computing device which may implement the embodiments described herein. The computing device of FIG. 8 may be used to perform embodiments of the functionality for a storage node or a non-volatile solid-state storage in accordance with some embodiments. The computing device includes a central processing unit (CPU) 801, which is coupled through a bus 805 to a memory 803, and mass storage device 807. Mass storage device 807 represents a persistent data storage device such as a disc drive, which may be local or remote in some embodiments. The mass storage device 807 could implement a backup storage, in some embodiments. Memory 803 may include read only memory, random access memory, etc. Applications resident on the computing device may be stored on or accessed via a computer readable medium such as memory 803 or mass storage device 807 in some embodiments. Applications may also be in the form of modulated electronic signals modulated accessed via a network modem or other network interface of the computing device. It should be appreciated that CPU 801 may be embodied in a general-purpose processor, a special purpose processor, or a specially programmed logic device in some embodiments.

Display 811 is in communication with CPU 801, memory 803, and mass storage device 807, through bus 805. Display 811 is configured to display any visualization tools or reports associated with the system described herein. Input/output device 809 is coupled to bus 805 in order to communicate information in command selections to CPU 801. It should be appreciated that data to and from external devices may be communicated through the input/output device 809. CPU 801 can be defined to execute the functionality described herein to enable the functionality described with reference to FIGS. 1-7. The code embodying this functionality may be stored within memory 803 or mass storage device 807 for execution by a processor such as CPU 801 in some embodiments. The operating system on the computing device may be MS-WINDOWS™, UNIX™, LINUX™, iOS™, CentOS™, Android™, Redhat Linux™, z/OS™, or other known operating systems. It should be appreciated that the embodiments described herein may be integrated with virtualized computing system also.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

In various embodiments, one or more portions of the methods and mechanisms described herein may form part of a cloud-computing environment. In such embodiments, resources may be provided over the Internet as services according to one or more various models. Such models may include Infrastructure as a Service (IaaS), Platform as a Service (PaaS), and Software as a Service (SaaS). In IaaS, computer infrastructure is delivered as a service. In such a case, the computing equipment is generally owned and operated by the service provider. In the PaaS model, software tools and underlying equipment used by developers to develop software solutions may be provided as a service and hosted by the service provider. SaaS typically includes a service provider licensing software as a service on demand. The service provider may host the software, or may deploy the software to a customer for a given period of time. Numerous combinations of the above models are possible and are contemplated.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A method of applying scheduling policies to a non-volatile solid-state storage, comprising:
   distributing user data throughout a plurality of storage nodes through erasure coding, wherein the plurality of storage nodes are housed within a single chassis that couples the storage nodes as a cluster;
   receiving operations relating to a non-volatile memory of a non-volatile solid-state storage of one of the plurality of storage nodes into a plurality of operation queues;
   evaluating each of the operations in the plurality of operation queues as to benefit to the non-volatile solid-state storage according to a plurality of policies;
   for each channel of a plurality of channels coupling the operation queues to the non-volatile memory, iterating a selection and an execution of a next operation from the plurality of operation queues, with each next operation having a greater benefit than at least a subset of operations remaining in the operation queues; and
   assigning sequential addresses, within a bounded address space, to newly arriving data write operations, wherein a first data write resulting from a garbage collection is accorded a lower benefit than a second data write of the newly arriving data write operations as a result of the first data write referencing a lower address than the second data write, wherein at least one method operation is performed by a processor.

2. The method of claim 1, wherein the operations include reading from the non-volatile memory, writing to the non-volatile memory, and erasing a portion of the non-volatile memory, and wherein the method comprises:
   repeating the receiving for additional storage nodes; and
   evaluating operations across the additional storage nodes as to the benefit.

3. The method of claim 1, further comprising:
   reevaluating the operations remaining in the operation queues as to the benefit, wherein the reevaluating takes into account an aging of the operations remaining in the operation queues.

4. The method of claim 1, wherein the selection of the next operation from the plurality of operation queues includes one of selecting an operation from among operations at heads of the plurality of operation queues, or selecting an operation from anywhere in operation queues coupled to the each channel.

5. The method of claim 1, wherein:
   at least one of the operations relating to the non-volatile memory includes a tag;
   the tag indicates one of an inode identifier (ID) is being accessed, a medium address is being accessed, or a priority is attached by a filesystem to the at least one of the operations; and
   the evaluating assigns the benefit based on the tag.

6. The method of claim 1, further comprising:
   pausing an interruptible operation having a first benefit according to the plurality of policies, wherein the interruptible operation is one of an interruptible write or an interruptible erase;
   executing an operation having a second benefit, according to the plurality of policies, greater than the first benefit; and
   resuming the interruptible operation, responsive to completing the write or erase operation having the second benefit.

7. A storage cluster, comprising:
   a plurality of storage nodes within a single chassis;
   each of the plurality of storage nodes having nonvolatile solid-state memory for storage of user data, the nonvolatile solid-state memory comprising:
   a plurality of operation queues;
      a plurality of channel busses, configured to couple the plurality of operation queues to a non-volatile memory, each of the plurality of channel busses having a channel;
      a processor, configured to perform repeating actions including:
         determining a relative benefit of each of a plurality of operations in the plurality of operation queues, based on a plurality of policies, the plurality of policies including assigning sequential addresses, within a bounded address space, to newly arriving data write operations, wherein a first data write resulting from a garbage collection is accorded a lower benefit than a second data write of the newly arriving data write operations as a result of the first data write referencing a lower address than the second data write;
         determining for each channel one of the plurality of operations in the plurality of operation queues having a greater relative benefit than others of the plurality of operations in the plurality of operation queues; and
         performing, for each channel, the determined one of the plurality of operations.

8. The storage cluster of claim 7, wherein each of the channel busses has, among the plurality of operation queues, at least one read queue, at least one write queue, and at least one erase queue.

9. The storage cluster of claim 7, wherein the plurality of policies includes operations on user data per client request having higher benefit than operations resulting from garbage collection.

10. The storage cluster of claim 7, wherein determining the relative benefit is based at least in part on aging of the operations in the plurality of operation queues.

11. The storage cluster of claim 7, wherein the actions further include interrupting one of an interruptible write or an interruptible erase in order to execute an operation having a greater relative benefit than the interruptible write or the interruptible erase.

12. The storage cluster of claim 7, wherein the processor determines the relative benefit based in part on addresses associated with operations.

13. A storage cluster comprising:
a plurality of storage nodes within a single chassis;
each of the plurality of storage nodes having nonvolatile solid-state memory for storage of user data, the nonvolatile solid-state memory comprising:
a non-volatile memory;
a controller, coupled to the non-volatile memory;
a plurality of queues, coupled to or included in the controller, the plurality of queues coupled to the non-volatile memory by a plurality of channels, each of the plurality of queues configured to hold therein a plurality of operations relating to the non-volatile memory; and
the controller configured to perform actions including:
weighting each operation in each of the plurality of queues, according to a plurality of policies, the plurality of policies including assigning sequential addresses, within a bounded address space, to newly arriving data write operations, wherein a first data write resulting from a garbage collection is accorded a lower benefit than a second data write of the newly arriving data write operations as a result of the first data write referencing a lower address than the second data write;
selecting, for each of the plurality of channels, a next operation from the plurality of queues, according to the weighting; and
executing, for each of the plurality of channels, the next operation.

14. The storage cluster of claim 13, further comprising:
the non-volatile memory includes a plurality of non-volatile dies; and
a plurality of channel busses, wherein each of the plurality of channels is coupled to a subset of the plurality of non-volatile dies by a one of the plurality of channel busses.

15. The storage cluster of claim 13, wherein the plurality of queues includes at least one of a read queue, a write queue, an erase queue, or queues according to traffic classes.

16. The storage cluster of claim 13, further comprising:
the non-volatile memory includes a plurality of non-volatile dies, wherein the plurality of queues coupled to the non-volatile memory by the plurality of channels includes each channel coupling to a subset of the plurality of queues and to a subset of the plurality of dies according to addresses of the subset of the plurality of dies.

17. The storage cluster of claim 13, further comprising:
each of the plurality of queues configured to associate a weighting parameter with each of the plurality of operations therein, wherein the weighting parameter includes at least one of a tag relating to an address space, a result of the weighting according to the plurality of policies, or an aging parameter relating to length of time each of the plurality of operations is present in each of the plurality of queues.

18. The storage cluster of claim 13, wherein the plurality of policies is selected from a group consisting of:
writing user data per client request has higher benefit than a data write resulting from garbage collection;
reading user data per client request has higher benefit than a data read resulting from garbage collection;
reading user data has higher benefit than erasing;
writing user data has higher benefit than erasing;
data reads or writes on an indicated client critical path have higher benefit than data reads or writes not on an indicated client critical path;
a data write operation that has been in a queue for a longer time has greater benefit than a data write operation that has been in a queue for a shorter time; and
a data read operation that has been in a queue for a longer time has greater benefit than a data read operation that has been in a queue for a shorter time.

19. The storage cluster of claim 13, wherein the plurality of policies comprises:
erasing has highest benefit if the erasing prevents having insufficient storage capacity for new writes;
data writes having shorter latency have higher benefit than data writes having longer latency; and
data reads having shorter latency have higher benefit than data reads having longer latency.

\* \* \* \* \*